(12) United States Patent
Parkhou et al.

(10) Patent No.: US 9,568,532 B2
(45) Date of Patent: Feb. 14, 2017

(54) WIND TURBINE FAULT DETECTION CIRCUIT AND METHOD

(75) Inventors: Masoud Parkhou, Hammel (DK); Xue Wen Luo, Singapore (SG); Michael Casem Tumabcao, Singapore (SG)

(73) Assignee: VESTAS WIND SYSTEMS A/S, Aarhus N (DK)

( * ) Notice: Subject to any disclaimer, the term of this patent is extended or adjusted under 35 U.S.C. 154(b) by 663 days.

(21) Appl. No.: 13/980,543

(22) PCT Filed: Jan. 20, 2012

(86) PCT No.: PCT/DK2012/050023
§ 371 (c)(1),
(2), (4) Date: Dec. 5, 2013

(87) PCT Pub. No.: WO2012/097825
PCT Pub. Date: Jul. 26, 2012

(65) Prior Publication Data
US 2014/0112032 A1 Apr. 24, 2014

Related U.S. Application Data

(60) Provisional application No. 61/434,890, filed on Jan. 21, 2011.

(30) Foreign Application Priority Data

Jan. 21, 2011 (DK) .................. 2011 70032

(51) Int. Cl.
*G01R 31/02* (2006.01)
*H02H 7/12* (2006.01)
(Continued)

(52) U.S. Cl.
CPC ............ *G01R 31/025* (2013.01); *F03D 9/003* (2013.01); *F03D 17/00* (2016.05); *G01R 31/42* (2013.01);
(Continued)

(58) Field of Classification Search
CPC ....... G01R 31/025; G01R 31/42; F03D 9/003; F03D 11/0091; H02H 3/16; H02H 7/06; H02H 7/1216; F05B 2220/7064; F05B 2260/80; F05B 2270/107; Y02E 10/722; Y02E 10/725
(Continued)

(56) References Cited

U.S. PATENT DOCUMENTS 4,372,398 A * 2/1983 Kuckes .................. E21B 47/02
166/66.5
5,568,373 A 10/1996 Small
(Continued)

FOREIGN PATENT DOCUMENTS

EP 1754887 A1 2/2007
EP 2141788 A2 1/2010
(Continued)

OTHER PUBLICATIONS

Extended European Search Report and Written Opinion, EP11382376.9, May 8, 2012.
(Continued)

*Primary Examiner* — Hoai-An D Nguyen
(74) *Attorney, Agent, or Firm* — Patterson + Sheridan, LLP

(57) ABSTRACT

A wind turbine fault detection circuit is designed to determine presence of a fault. In a described embodiment, the wind turbine fault detection circuit utilizes a magnetometer in the form of a hall-effect sensor coupled between a power converter and a ground element to measure a ground current from the power converter to obtain a real ground current. The wind turbine fault detection circuit utilizes a comparator to determine presence of a fault based on the real ground current.

30 Claims, 8 Drawing Sheets

(51) Int. Cl.
  *H02H 3/16* (2006.01)
  *F03D 9/00* (2016.01)
  *G01R 31/42* (2006.01)
  *H02H 7/06* (2006.01)

(52) U.S. Cl.
  CPC ............ H02H 3/16 (2013.01); H02H 7/1216 (2013.01); *F05B 2220/7064* (2013.01); *F05B 2260/80* (2013.01); *F05B 2270/107* (2013.01); *H02H 7/06* (2013.01); *Y02E 10/722* (2013.01); *Y02E 10/725* (2013.01)

(58) Field of Classification Search
  USPC ................. 324/529, 528, 527, 512, 500
  See application file for complete search history.

(56) References Cited

U.S. PATENT DOCUMENTS

| | | | |
|---|---|---|---|
| 5,691,643 A | | 11/1997 | Ishiguro et al. |
| 5,712,572 A | * | 1/1998 | Tamechika ............ H02S 50/10 324/509 |
| 5,793,593 A | | 8/1998 | Reed et al. |
| 6,285,533 B1 | * | 9/2001 | Sakamoto ............... H02H 7/06 361/23 |
| 7,521,822 B2 | | 4/2009 | Lorenz |
| 2001/0004322 A1 | * | 6/2001 | Kurokami ......... H02M 7/53873 363/56.03 |
| 2003/0043516 A1 | | 3/2003 | Ahlstrom et al. |
| 2005/0099743 A1 | | 5/2005 | Lee |
| 2006/0284613 A1 | | 12/2006 | Hastings et al. |
| 2007/0024288 A1 | * | 2/2007 | Hu .................... H02M 3/33507 324/547 |
| 2009/0322083 A1 | * | 12/2009 | Wagoner .................. H02J 3/38 290/44 |
| 2013/0021009 A1 | * | 1/2013 | Waltman ............... H02M 3/156 323/271 |
| 2013/0154484 A1 | * | 6/2013 | Xu ..................... H05B 33/0827 315/122 |

FOREIGN PATENT DOCUMENTS

| | | |
|---|---|---|
| JP | 2008-245465 A | 10/2008 |
| WO | 2010/133721 A1 | 11/2010 |

OTHER PUBLICATIONS

Danish Search Report, PA 2011 70032, Sep. 6, 2011.
International Search Report and Written Opinion, PCT/DK2012/050023, May 22, 2012.

* cited by examiner

WIND TURBINE FAULT DETECTION CIRCUIT AND METHOD

BACKGROUND AND FIELD OF THE INVENTION

The invention relates to a wind turbine fault detection circuit and method.

It is known to use current sensors for power converter systems to determine presence of ground faults which may cause loss of power and create safety hazards. A common approach of detecting ground faults of a three-phase power converter is to sum current outputs of the power converter. A desired result would be when the output currents are balanced, i.e. the output currents are 120° out of phase with each other and of equal magnitude, and the output currents cancel each other to result in a summed current value of zero. If, on the other hand, there is a current leak in the power converter, a non-zero reading is recorded at the output of the power converter and this is an indication of a possible ground fault.

However, such a method of detecting ground faults may not be accurate or reliable due to noise created by converter switching that is coupled through a circuit breaker (CB). This noise is usually coupled through stray parameters (stray inductance or capacitance) within or outside the CB.

It is an object of the present invention to provide a wind turbine fault detection circuit and method which addresses at least one of the disadvantages of the prior art and/or to provide the public with a useful choice.

SUMMARY OF THE INVENTION

In general, the invention proposes directly measuring or detecting real ground current and using the detected real ground current to determine whether a fault condition is present or not.

In a first specific expression of the invention, there is provided a wind turbine comprising a power converter arranged to receive electrical power from an electrical generator and to provide conditioned electrical power, comprising a plurality of electrical switches operating at a high frequency, the power converter housed in a power converter cabinet, a fault detection circuit comprising a magnetometer configured to measure a ground current flowing from the power converter cabinet to a ground element to obtain a real ground current; and a comparator configured to determine the presence of a fault, based on the real ground current.

In a second specific expression of the invention, there is provided a fault detection method for a wind turbine, the method comprising
measuring a ground current flowing from the power converter to a ground element of the power converter to obtain a real ground current; and determining presence of a fault based on the real ground current.

An advantage of the described embodiment is that this enables a more accurate measurement of the real ground current and thus a more reliable and accurate identification of fault conditions.

Preferred features will next be described based on the first expression but it should be appreciated that these features are also applicable to the second expression of the invention.

Preferably, the magnetometer is configured to measure an Alternating Current (AC) component as well as a Direct Current (DC) component of the ground current. In this way, a more reliable measurement is obtained. The magnetometer may be coupled directly to a bus bar and the bus bar may be arranged to electrically couple the power converter to the ground element.

The magnetometer may be coupled across a slot of the bus bar, and may be configured to measure the ground current partially to obtain the real ground current. In this way, this reduces the ground impedance and the arrangement is particularly suitable for measuring currents of less than 200 A. In the alternative, the wind turbine fault detection circuit may comprise a magnetic circuit arranged to detect a magnetic field created by the ground current flowing through a bus bar. The bus bar may be arranged to electrically couple the power converter to the ground element. This enables the magnetometer to measure the magnetic field to measure the ground current, and this alternative arrangement is particularly useful for measuring currents of more than 200 A.

The bus bar may be arranged to be electrically coupled to the power converter via a power converter cabinet, or directly to the power converter.

Advantageously, the magnetometer includes a Hall-Effect sensor. The circuit may comprise a shunt release arranged to open a circuit breaker when a ground fault is detected.

In one example, the comparator may an op-amp. In another example, the circuit may comprise a current sensor device arranged to measure a 3-phase output current from the power converter, and in this case, the comparator may include a processor configured to process the real ground current and the three-phase output current of the power converter. Preferably, the processor is configured to sum the three-phase current to produce a resultant current output. Further, the processor may be configured to compare the real ground current and the resultant current output with a reference. Based on the comparison, the processor may be configured to indicate a partial discharge condition when the real ground current is less than the reference, and the resultant current output is more than the reference. If there is a partial discharge condition, the processor may be configured to transmit the partial discharge condition to a diagnostic system for analysis.

As a first alternative, the processor may be configured to indicate a measurement error condition when the real ground current is more than the reference, and the resultant current output is less than the reference. As a second alternative, the processor may be configured to indicate a ground fault condition when the real ground current is more than the reference, and the resultant current output is more than the reference. If a ground fault condition is present, the processor may be configured to control a shunt release to open a circuit breaker.

The fault detection circuit may form part of a wind turbine diagnostic system, a circuit breaker or a wind turbine.

BRIEF DESCRIPTION OF THE DRAWINGS

An embodiment of the invention will now be described with reference to the accompanying drawings, in which.

DETAILED DESCRIPTION OF PREFERRED EMBODIMENT

Figure 1:
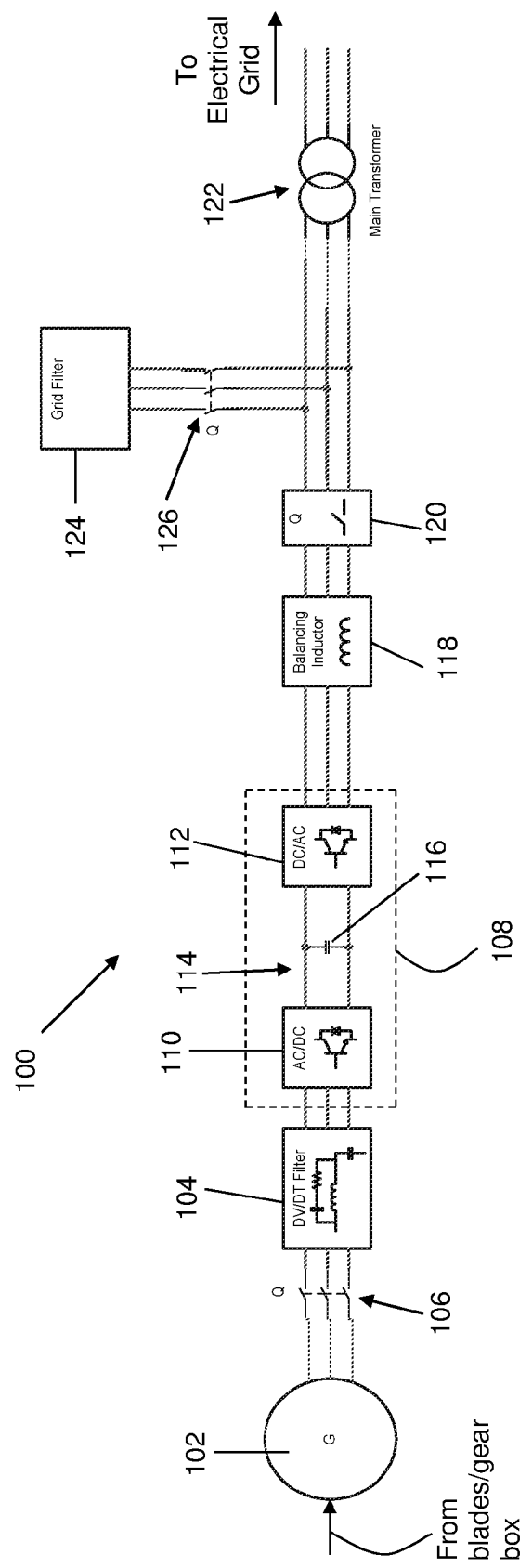
FIG. 1 is a block diagram showing an overview of an electrical system of a wind turbine which includes a power converter according to an embodiment of the invention.

FIG. 1 is a block diagram showing an overview of an electrical system 100 of a wind turbine according to an embodiment of the invention. The electrical system 100 includes a generator 102 configured to convert mechanical energy from the turning of rotor blades (not shown) of the wind turbine to electrical energy. As it is understood, a gear box may be used to step up a low rotational speed of the rotor blades to a higher rotational speed suitable for operating the generator 102. The gear box may be omitted if the generator 102 is a multi-pole generator adapted to receive the low rotational speed of the rotor blades.

The generator 102 in this embodiment is a permanent magnet synchronous generator. As an alternative, the generator may be a singly or doubly-fed synchronous generator, an induction generator or any other type of generator comprising a stator winding. Typically, the electrical system 100 is provided in a nacelle (not shown) of the wind turbine.

The electrical energy from the generator 102 is provided as a 3-phase alternating current (AC) voltage and this voltage is passed to a differential filter 104 for smoothing the voltage via a first array of switches 106. The differential filter's filtered output is fed to a power converter 108 to condition the electrical energy provided by the generator 102. The power converter 108 comprises an AC/DC converter 110 coupled to a DC/AC converter 112 via a DC link 114. The AC/DC converter 110 is configured to convert the filtered AC voltage to a DC voltage which is provided to the DC link 114. The DC link 114 includes a DC capacitor 116 for smoothing the power by reducing voltage ripples on the DC link 114. The AC/DC converter 110 and the DC/AC converter 112 comprise a plurality of electronic switching devices, and in this embodiment, Insulated Gate Bipolar Transistors (IGBT), for carrying out the voltage conversion functions. Power converters are well known in the art, and other switching devices, such as Silicon Carbide Transistors, Metal Oxide Semiconductor Field-Effect Transistors (MOSFETs), Gate Turn-Off Thyristors (GTOs), Bipolar Junction Transistors (BJTs), or thyristors, may be used.

Other electrical system or power converter topologies are also possible. Further, it is stated that the electrical system 100 may comprise a plurality of power converters, all of which may be collectively referred to and operating as a single power converter.

The DC/AC converter 112 is configured to invert the DC voltage on the DC link 114 to a regulated AC voltage. The electrical system 100 includes balancing inductors 118 for filtering the regulated AC voltage for example, by removing higher order harmonics prior to feeding the regulated AC voltage to a second array of switches 120, which functions as a circuit breaker (CB). The second array of switches 120 when closed feeds the regulated AC voltage to a main transformer 122 which transforms the regulated AC voltage to suitable AC voltage for transmission to an electrical grid (not shown). As shown in FIG. 1, grid filters 124 may be used, via a third array of switches 126, to filter the voltage from the second array of switches 120 to keep interference or harmonic distortions at a low level prior to transmitting the voltage to the main transformer 122.

It should be appreciated that although the differential filter 104, balancing inductors 118, the array of switches 106,120, 126 and the grid filter 124 are illustrated separate from the power converter 108, these components may be considered part of the power converter 108.

Figure 2:
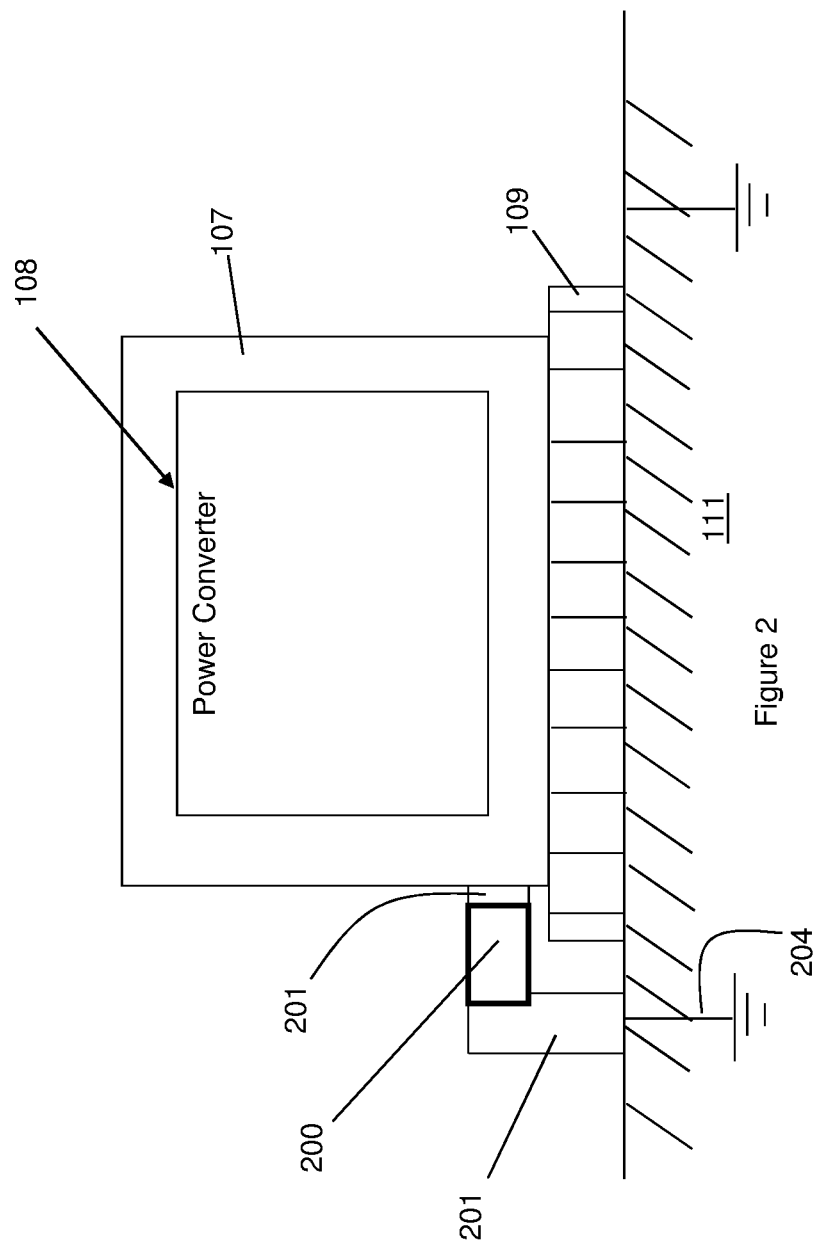
FIG. 2 is a close-up diagrammatic representation of the power converter of FIG. 1 which includes a fault detection circuit.

FIG. 2 is a diagrammatic representation of the power converter 108 of a wind turbine. According to the embodiment, the power converter 108 is housed inside a converter cabinet 107. The converter cabinet 107 is mounted on the floor 111 of the nacelle and an electrical insulation 109 is provided between the converter cabinet 107 and the floor 111. In this embodiment, the electrical system 100 includes a fault detection circuit 200 electrically coupled between the converter cabinet 107 and ground 204 via a bus bar 201. The ground 204 is a grounding circuit coupling the floor 111 of the nacelle to a direct physical connection to earth or any other suitable grounding system. It is noted that the converter cabinet 107 is designed to allow a path of lowest impedance to the ground 204 through the fault detection circuit 200. It is envisaged that the fault detection circuit 200 may be directly coupled between the power converter 108 and ground 204.

Figure 3:
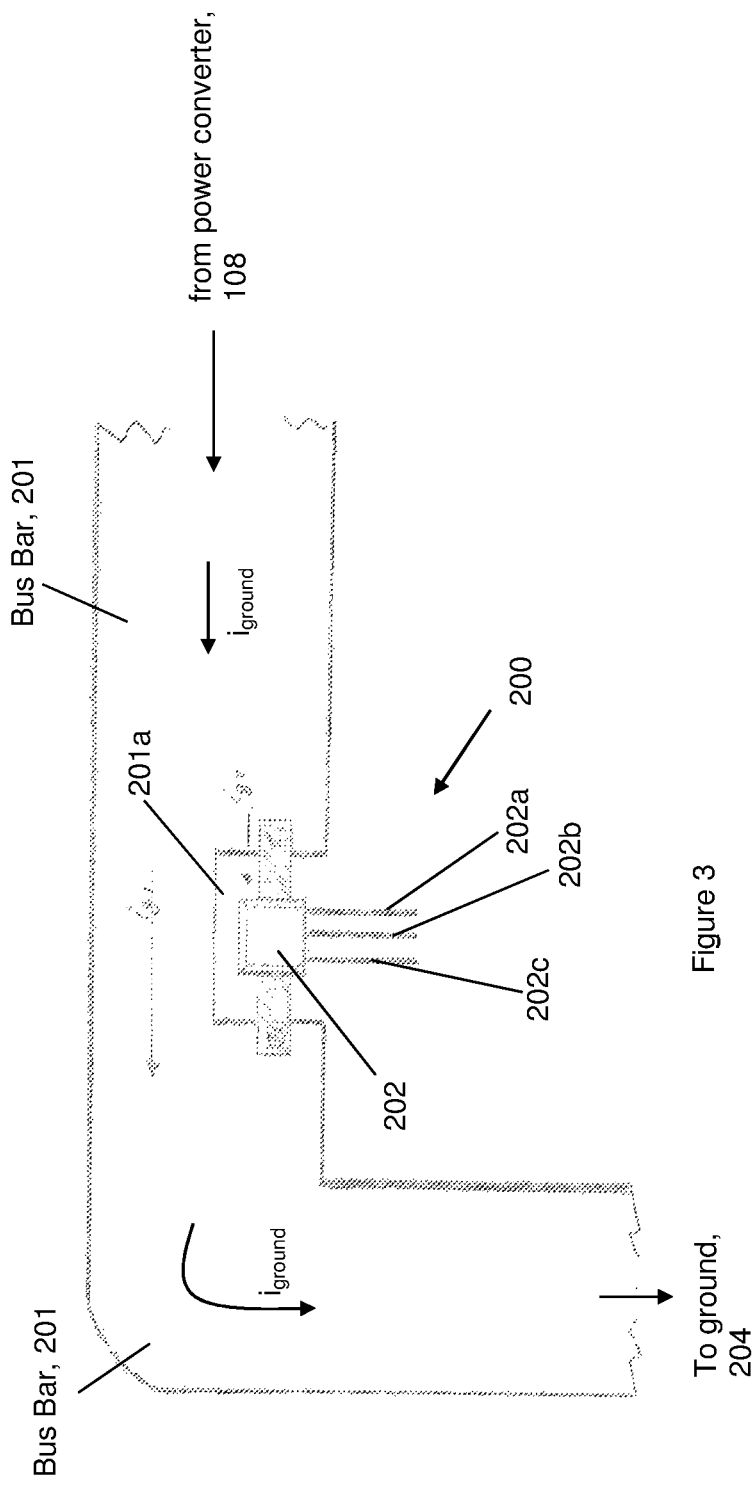
FIG. 3 illustrates how a Hall Effect sensor of the fault detection circuit of FIG. 2 is electrically connected between the power converter and ground to detect real ground current.

FIG. 3 shows a schematic arrangement of the fault detection circuit 200 of FIG. 2, which includes a magnetometer and in this embodiment, the magnetometer is in the form of a hall-effect sensor 202. The hall-effect sensor 202 is coupled between the power converter cabinet 107 and ground 204 via the bus bar 201, and arranged to detect or measure a ground current $i_{ground}$. The hall-effect sensor has an integrated conductor (not shown) to allow only a partial part of the ground current $i_{ground}$ to pass through the integrated conductor so that the total ground impedance is not affected by the presence of the hall-effect sensor and remains low. The conductor bus bar 201 includes a slot 201a and the hall-effect sensor 202 is arranged across the slot 201a as shown in FIG. 3 to allow a partial ground current to flow to hall-effect sensor's integrated conductor. In other words, if the ground current ground from the power converter 108 is considered to comprise partial currents $i_{g1}$ and $i_{g2}$, the partial current $i_{g2}$ would flow across the slot 201a through the hall-effect sensor's integrated conductor with the other partial current $i_{g1}$ flowing through the bus bar 201. Due to the low ground impedance arrangement mentioned above, the two partial currents $i_{g1}$ and $i_{g2}$ are summed together to form ground again after the hall-effect sensor and flows to ground 204.

With the above arrangement, this allows the converter grounding through the detection circuit 200 to remain effective and is particularly advantageous for sensing currents of less than 200 A. Input terminals 202a,202b correspond respectively to the $V^+$ and $V^-$ terminals of the hall effect sensor 202 and are coupled to appropriate voltage levels in order for the hall effect sensor 202 to accurately detect the partial ground current $i_{g2}$ as a real ground current Ig passing through the bus bar 201 from the power converter 108 (i.e. via the power converter cabinet 107) to the ground 204. The detected real ground current Ig is then converted to a voltage output $V_{out}$ at its output terminal 202c which is used to determine the presence of a fault condition. The fault condition may be a ground fault which may occur in the following situations:
  i. when any output line voltage of the power converter 108 shorts to ground;
  ii. arcing due to fast and high voltage impulses of switching devices of the AC/DC converter 110 or the DC/AC converter 112; or
  iii. short to ground by faulty switching devices of the AC/DC converter 110 or the DC/AC converter 112.

In this embodiment, two examples will be provided to determine the presence of a fault condition.

Figure 4:
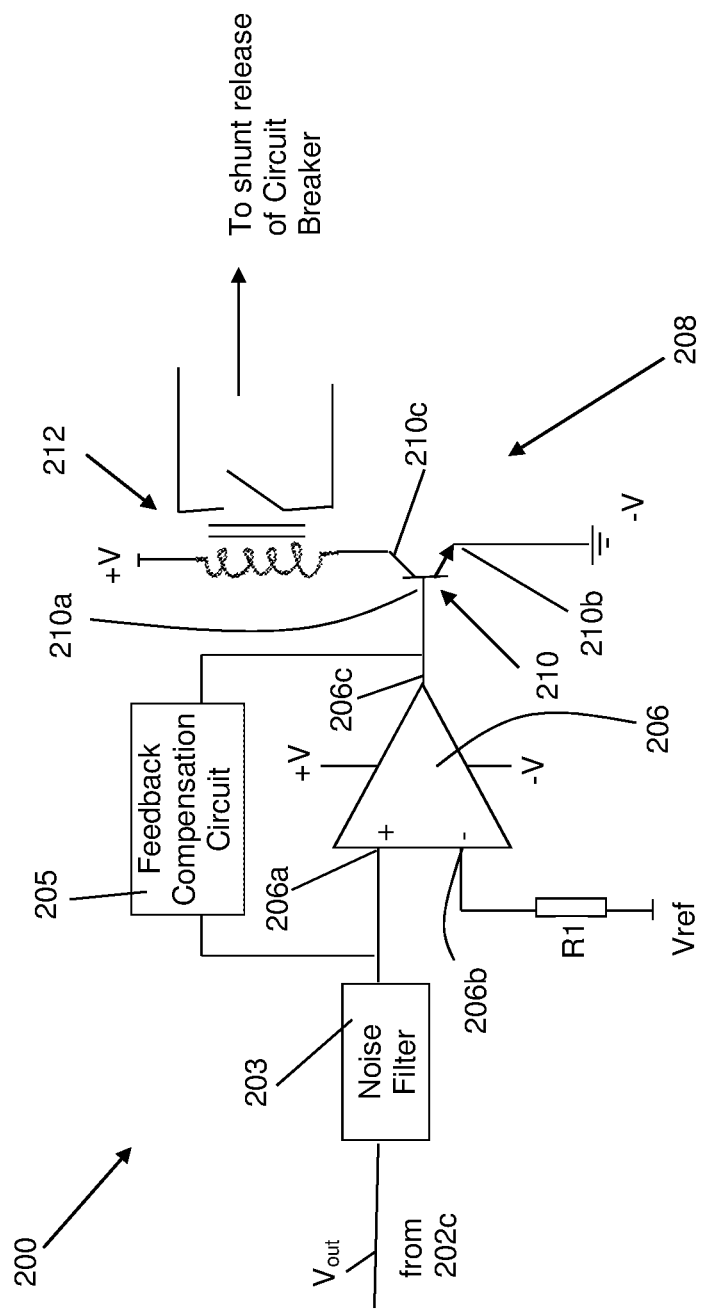
FIG. 4 is a schematic diagram illustrating a first example of processing the real ground current to determine the presence of a fault condition.

A first example of processing the real ground current is shown in FIG. 4 which utilizes mainly analog devices for processing. The fault detection circuit 200 includes an op-amp 206 configured as a comparator with the op-amp's positive input 206a coupled to the voltage output 202c of the hall-effect sensor 202 via a noise filter 203. The op-amp's negative input 206b is coupled to a reference voltage (Vref) of 2.5V via a resistor R1. The op-amp's positive and negative power supply terminals are respectively coupled to a DC voltage source and 0V. In this way, this creates an op-amp output 206c which switches between about high and low depending on the voltage at the positive input 206a of the op-amp 206 to control a switch circuit 208. The fault detection circuit 200 also includes a feedback compensation circuit 205 which provides a feedback loop between the op-amp output 206c and the positive input 206a.

The switch circuit 208 includes a transistor 210 configured to drive a relay switch 212. The relay switch may be connected to the UVR (under voltage release) of the CB 120 (see FIG. 1) or shunt release of the CB 120 so as to quickly open the power contacts of the CB 120 to isolate or discontinue the power flow to the main transformer 122. The relay switch 212 may be isolated on non-isolated. Examples of an isolated relay switch include a solenoid or an opto isolator that provides isolation between the hall-effect sensor 202 and the CB 120, so that in the event of a fault on the sensor circuit, the CB 120 is not damaged. If the speed of sensing is important, a non-isolated or direct connection to the CB 120 may be preferred.

As shown in FIG. 4, the transistor's base 210a is connected to the op-amp's output 206c, the transistor's emitter 210b connected to ground or zero volts, and the transistor's collector 210c connected to the relay switch 212.

The fault detection circuit 200 of FIG. 4 operates in the following manner. In this embodiment, the hall-effect sensor 202 is configured to detect a ground current of 100 A and to output a voltage of 2.5V at $V_{out}$ 202c, i.e. for every 100 A detected, a measurement value of 2.5V is provided. This is configured to match up with the reference voltage of 2.5V at the negative input 206b of the op-amp 206. Typically, the reference voltage is set between 0 and 5V to correspond with the transistor logic voltage settings. However, both the op-amp 206 and the hall-effect sensor 202 may be configured with any reasonable setting in order to detect the real ground current Ig. If there is no ground current $I_{ground}$ flowing to the ground 204 or if the detected real ground current Ig (i.e. $i_{g2}$ in FIG. 3) translates to a voltage of less than the voltage reference of 2.5V, the op-amp's output 206c is at a low value of about 0V. The transistor 210 is OFF, and the relay switch 212 is in the closed position. The power converter 108 thus operates in a normal manner.

When the hall-effect sensor 202 detects real ground current Ig which converts to $V_{out}$ which is higher than the reference voltage at the negative input 206b, the op-amp's output 206c switches to a high state. When this happens, the transistor 210 is turned ON which drives the relay switch 212 to the close position which activates the CB 120 to disconnect the electrical system 100 from the main transformer 122. In other words, detection of real ground current Ig which converts to more than 2.5V indicates the presence of a fault condition which requires breaking the CB 120 to protect the power converter 108.

The use of the hall-effect sensor 202 is particularly advantageous because the hall-effect sensor 202 is able to detect the real ground current with pulsating DC or even an AC current with DC component. In this way, the fault detection circuit is able to detect a fault condition in a more reliable manner.

Figure 5:
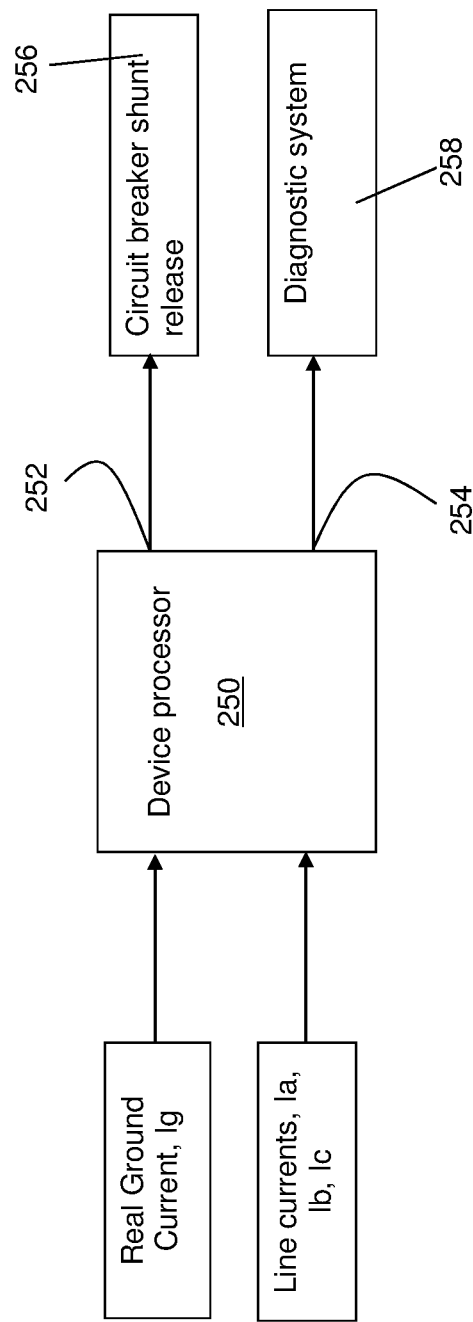
FIG. 5 is a block diagram illustrating a second example of processing the real ground current using a processor to determine the presence of a fault condition.
Figure 6:
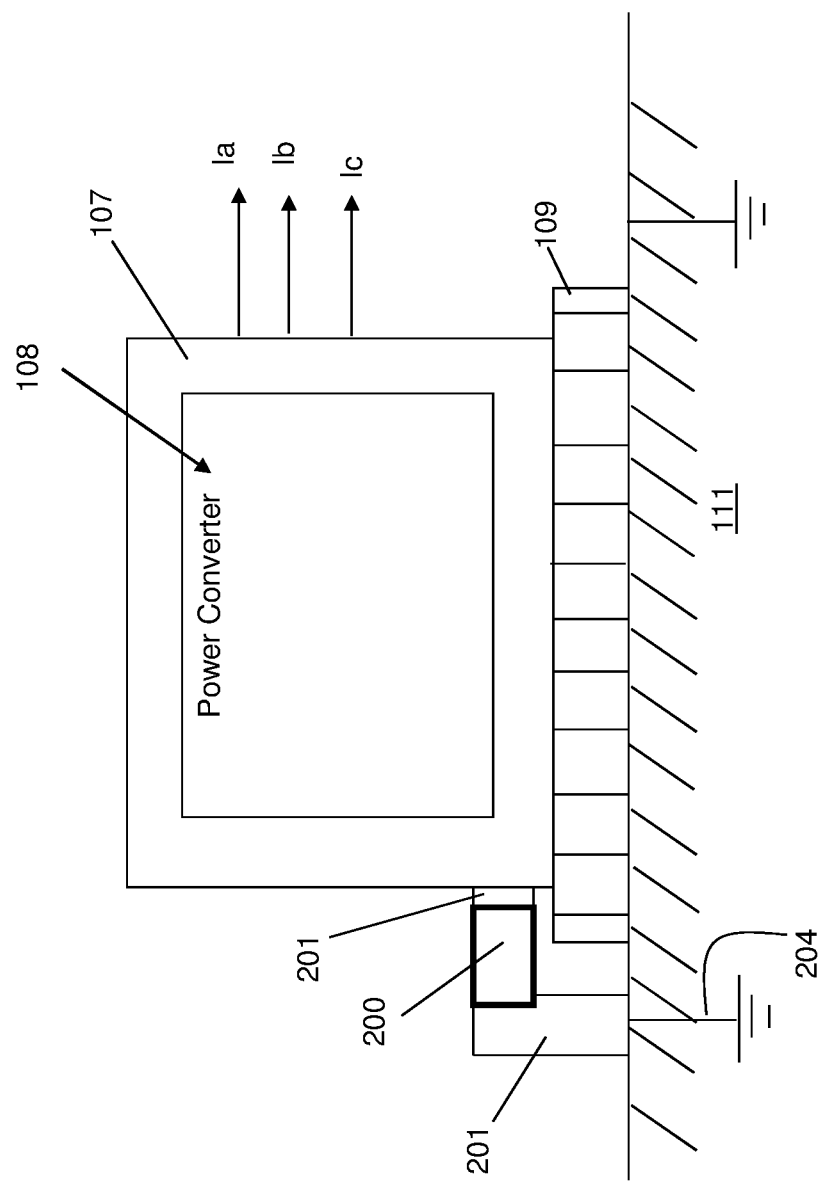
FIG. 6 shows the power converter of FIG. 2 including the power converter's three phase output currents.

FIG. 5 is a block diagram illustrating a second example of processing the real ground current Ig to determine the presence of a fault condition, which may be considered to be generally a digital processing approach. As shown in FIG. 5, instead of an op-amp 206 and a switch circuit 208, this example includes a comparator comprising a device processor 250 configured to receive a measurement of the real ground current Ig from the hall-effect sensor 202. Further, current sensors (not shown) are used to measure three-phase line currents at the output of the power converter 108 i.e. the outputs of the DC/AC converter 112 of the power converter 108 (see FIG. 1), and the output line currents are designated as Ia, Ib and Ic as shown in FIG. 6.

Figure 7:
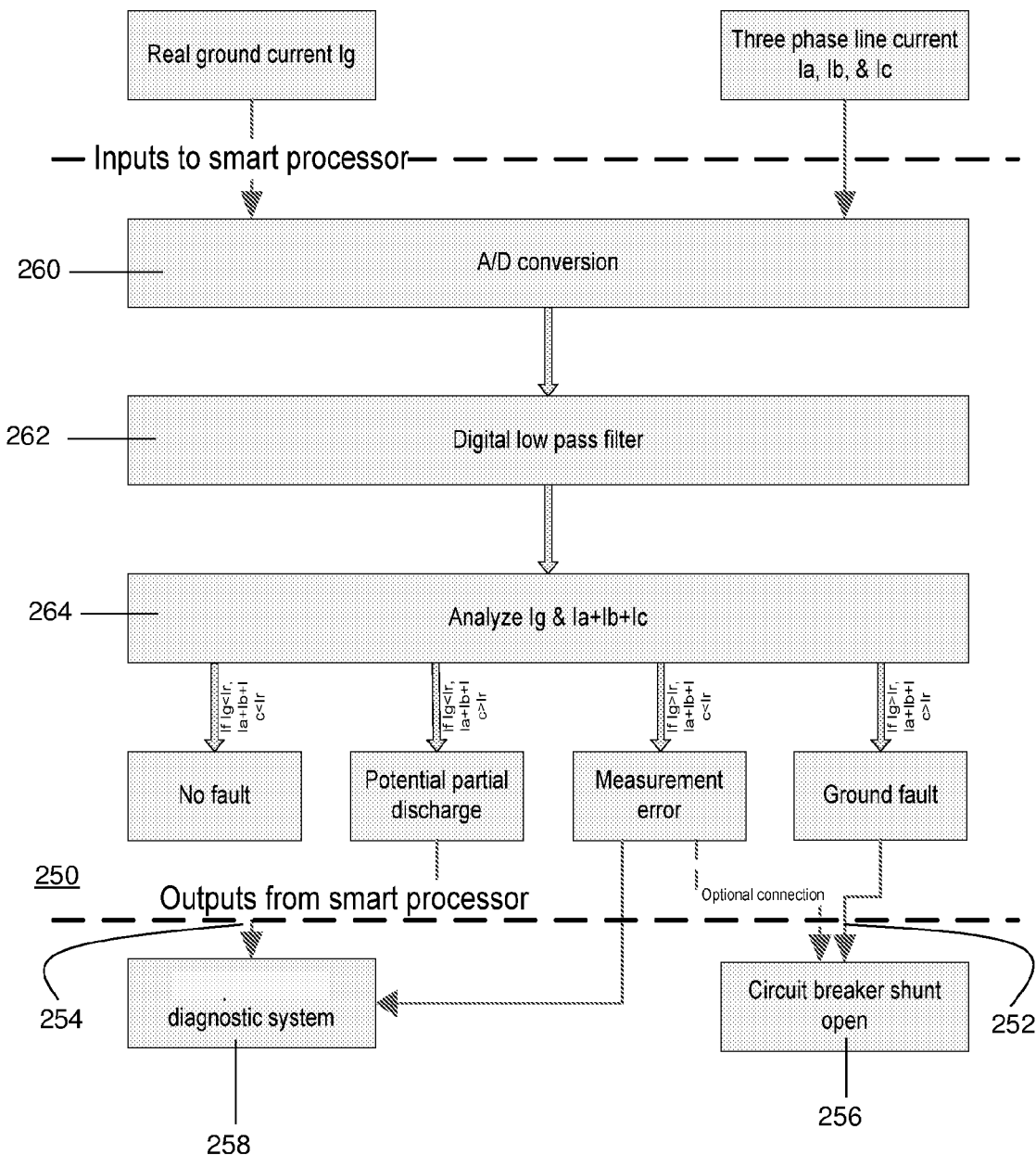
FIG. 7 shows an algorithm performed by the processor of FIG. 5 to determine the presence of a fault condition.

The measurements of output line currents Ia, Ib and Ic are likewise provided to the processor 250 and outputs 252,254 of the processor 250 are used to control a circuit breaker shunt release 256 and are also provided to a diagnostic system 258. FIG. 7 explains how the measurements of the real ground current Ig and the line currents Ia, Ib, Ic are processed by the processor 250 to control the circuit breaker shunt release 256 and are provided to the diagnostic system 258 for further analysis.

Upon receiving the measurements of the real ground current Ig and line currents Ia, Ib, Ic, the processor 250 digitizes the measurements at 260 to discrete current values. Next, the current values are subject to low pass filtering at 262 to remove unwanted high frequency noise. Further, the filtered current measurements Ia, Ib, Ic are summed together as Ia+Ib+Ic at 264 to form a resultant current output and analysed together with the filtered real ground current measurement Ig.

At 264, the analysis involves comparing Ig and Ia+Ib+Ic with a reference value, Ir to determine fault conditions, as follows:

| Scenario | Analysis | Possible Fault Condition |
| --- | --- | --- |
| i. | If Ig < Ir; and (Ia + Ib + Ic) < Ir. | No Fault |
| ii. | If Ig < Ir; and (Ia + Ib + Ic) > Ir. | Potential Partial Discharge |
| iii. | If Ig > Ir; and (Ia + Ib + Ic) < Ir. | Measurement Error (when the other monitoring indicators are correct) |
| iv. | If Ig > Ir; and (Ia + Ib + Ic) > Ir. | Ground Fault |

It should be appreciated that the current reference Ir may be determined during normal operating conditions of the electrical system 100 i.e. without any ground fault or partial discharge conditions. It is also envisaged that the references Ir may be determined during a design stage of the electrical system 100 as to what the current references would be when the power converter 108 is operating properly (i.e. without any fault conditions) and what a minimum tolerance level of the system might be before a fault occurs. When a fault condition occurs, the corresponding change in the Ig and (Ia+Ib+Ic) values are recorded and used to determine the current references Ir.

In the case of scenario (i), if the Ig and (Ia+Ib+Ic) values are less than the respective Ir, this represents a "no fault condition" and no preemptive action is taken by the processor 250.

For scenario (ii), where Ig<Ir and Ia+Ib+Ic>Ir, this represents a potential partial discharge condition, and as shown in FIG. 7, the processor 250 sends the information to a diagnostic system 258, which processes the information and may perform remedial actions for example, to locate the partial discharge location. Specifically, the diagnostic system 258 includes a memory bank in which the information is stored and for a user or operator to check on-site or remotely to obtain the information (e.g. time or day) of the fault or measurement error. The partial discharge may be in the form of an internal discharge (for example, caused by an insulation breakdown in a capacitor); surface discharge (for example, caused by breakdown of insulation of a conductor); corona discharge or electrical trees.

In scenario (iii), where Ig>Ir and (Ia+Ib+Ic)<Ir, this may indicate a measurement error and the processor 250 may send this information to either the diagnostic system 258 or to the circuit breaker shunt release 256.

In scenario (iv), where Ig>Ir and (Ia+Ib+Ic)>Ir, this may indicate that a ground fault exists, and the processor 250 then controls the circuit breaker shunt release 256 to open to break the CB 120 (see FIG. 1).

By using the real ground current Ig, and the line currents Ia,Ib,Ic, it can be appreciated that the fault detection circuit 200 can identify fault conditions in a more accurate and reliable manner.

The described embodiment should not to be construed as limitative. For example, the hall-effect sensor 202 is described to detect the real ground current, but it is envisaged that other suitable magnetometers may be used, such as a Rogowski coil as long as the Rogowski coil is adapted to detect or measure the real ground current from the ground. FIGS. 4 and 5 provide two examples of how the and processed to determine fault conditions, and it should be appreciated that other methods may be used.

In the case of FIG. 4, the voltage reference of 2.5V is exemplary only and other voltage references may be used depending on the electrical configuration of the power converter 108 and/or the electrical system 100. Referring to FIG. 7, although it is preferred to convert the detected currents Ig, Ia, Ib, Ic to digital values, it is possible to analyse the detected currents in the analog form.

Likewise, the low pass filtering at 262 of FIG. 7 may not be necessary if the signals are relatively free from noise.

It is envisaged that the CB 120 may comprise the current sensors for measuring the power converter output line currents Ia, Ib and Ic.

It is also envisaged that the circuit breaker 120 may be configured to perform a real ground fault measurement. This should be described as an embodiment having both the current sensors and a ground fault detection circuit, perhaps a bus-bar running into and out of the CB to ground.

Figure 8:
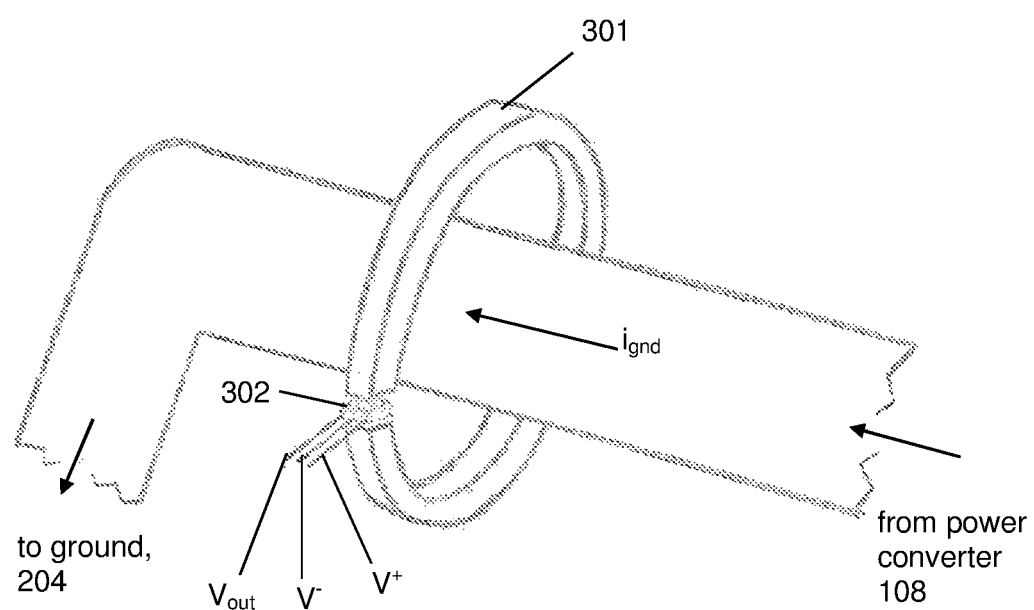
FIG. 8 illustrates an alternative configuration of the Hall Effect sensor to the arrangement of FIG. 3.

As explained in the described embodiment, the configuration of FIG. 3 is suitable for measuring low currents of less than 200 A. For high currents of more than 200 A, it may be preferred to use the configuration of FIG. 8 in which a bus bar 300 electrically couples the power converter 108 (or via the converter cabinet 107) to the ground 204. Instead of the hall-effect sensor 202 being directly coupled to the bus bar 201 via the slot 201a, a hall effect sensor 302 is arranged to detect a magnetic field generated by a magnetic core 301 arranged around the bus bar 300. The magnetic core 301 is arranged to measure any ground current $i_{gnd}$ flowing through the bus bar 300 from the power converter 108 to the ground 204 and this measurement translates to a magnetic field which is picked up by the hall effect sensor 302. In this way, the hall-effect sensor 302 is arranged to measure the entire ground current $i_{gnd}$ as the real ground current Ig which flows from the power converter 108 to the ground 204 (rather than partially as in FIG. 3). Similarly, the $V_{out}$ of the hall-effect sensor 302 is then used to determine presence of a ground fault and if the circuit of FIG. 4 is used, then the $V_{out}$ of the hall effect sensor 302 of FIG. 8 is similarly connected to the positive terminal 206a of the op-amp 206 of FIG. 4.

Having now described the invention, it should be apparent to one of ordinary skill in the art that many modifications can be made hereto without departing from the scope as claimed.

The invention claimed is:

1. A wind turbine, comprising:
   a ground element;
   a power converter arranged to receive electrical power from an electrical generator and to provide conditioned electrical power, the power converter comprising a plurality of electrical switches and housed in a power converter cabinet that is coupled with the ground element through a bus bar; and
   a fault detection circuit, comprising:
      a magnetometer arranged across a slot defined in the bus bar, the magnetometer configured to:
         measure a portion of a ground current flowing from the power converter cabinet to the ground element, and
         output a value representing a real ground current based on the measured portion of the ground current; and
      a comparator configured to determine presence of a fault based on the real ground current.

2. The wind turbine according to claim 1, wherein the magnetometer is configured to measure an Alternating Current (AC) component as well as a Direct Current (DC) component of the ground current.

3. The wind turbine according to claim 1, further comprising a current sensor device arranged to measure a three-phase output current from the power converter.

4. The wind turbine according to claim 3, wherein the comparator includes a processor configured to process the real ground current and the three-phase output current of the power converter.

5. The wind turbine according to claim 1, further comprising a magnetic circuit arranged to detect a magnetic field created by the ground current flowing through a bus bar, the bus bar being arranged to electrically couple the power converter cabinet to the ground element, wherein the magnetometer is arranged to measure the magnetic field to measure the ground current.

6. The wind turbine according to claim 1, wherein the magnetometer includes a Hall-Effect sensor.

7. The wind turbine according to claim 1, further comprising a shunt release arranged to open a circuit breaker when a ground fault is detected.

8. The wind turbine according to claim 1, wherein the comparator includes an op-amp.

9. The wind turbine according to claim 4, wherein the processor is configured to sum the three-phase current to produce a resultant current output.

10. The wind turbine according to claim 9, wherein the processor is configured to compare the real ground current and the resultant current output with a reference.

11. The wind turbine according to claim 10, wherein the processor is configured to indicate a partial discharge condition when the real ground current is less than the reference, and the resultant current output is more than the reference.

12. The wind turbine according to claim 11, wherein the processor is configured to transmit the partial discharge condition to a diagnostic system for analysis.

13. The wind turbine according to claim 10, wherein the processor is configured to indicate a measurement error condition when the real ground current is more than the reference, and the resultant current output is less than the reference.

14. The wind turbine according to claim 10, wherein the processor is configured to indicate a ground fault condition when the real ground current is more than the reference, and the resultant current output is more than the reference.

15. The wind turbine according to claim 14, wherein the processor is configured to control a shunt release to open a circuit breaker.

16. A fault detection method for a wind turbine, the method comprising:
measuring, by a magnetometer, a portion of a ground current flowing from a power converter cabinet housing a power converter to a ground element, wherein the power converter cabinet is coupled with the ground element through a bus bar, and wherein the magnetometer is arranged across a slot defined in the bus bar;
outputting a value representing a real ground current based on the measured portion of the ground current; and
determining presence of a fault based on the real ground current.

17. The fault detection method according to claim 16, further comprising comparing the real ground current with a reference to determine presence of a fault.

18. The fault detection method according to claim 17, wherein the comparison is performed by an op amp.

19. The fault detection method according to claim 16, further comprising measuring an Alternating Current (AC) component as well as a Direct Current (DC) component of the ground current.

20. The fault detection method according to claim 17, further comprising measuring the power converter's three-phase output currents.

21. The fault detection method according to claim 20, further comprising summing the three-phase output currents to produce a resultant current output.

22. The fault detection method according to claim 21, further comprising comparing the real ground current and the resultant current output with the reference.

23. The fault detection method according to claim 16, further comprising providing a magnetic circuit for detecting a magnetic field created by the ground current flowing through a bus bar, the bus bar being arranged to electrically couple the power converter cabinet to the ground element, and
the magnetometer measuring the magnetic field to measure the ground current.

24. The fault detection method according to claim 16, wherein the magnetometer includes a Hall-Effect sensor.

25. The fault detection method according to claim 16, further comprising controlling a shunt release to open a circuit breaker when a ground fault is detected.

26. The fault detection method according to claim 22, wherein when the real ground current is less than the reference, and the resultant current output is more than the reference, the method further comprises indicating a partial discharge condition.

27. The fault detection method according to claim 26, further comprising transmitting the partial discharge condition to a diagnostic system for analysis.

28. The fault detection method according to claim 22, wherein when the real ground current is more than the reference, and the resultant current output is less than the reference, the method further comprises indicating a measurement error condition.

29. The fault detection method according to claim 22, wherein when the real ground current is more than the reference, and the resultant current output is more than the reference, the method further comprises indicating a ground fault condition.

30. The fault detection method according to claim 22, further comprising controlling a shunt release to open a circuit breaker.

* * * * *